US011355682B2

(12) United States Patent
Wakamatsu

(10) Patent No.: US 11,355,682 B2
(45) Date of Patent: Jun. 7, 2022

(54) METHOD OF MANUFACTURING LIGHT EMITTING DEVICE AND LIGHT EMITTING DEVICE

(71) Applicant: NICHIA CORPORATION, Anan (JP)

(72) Inventor: Dai Wakamatsu, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/842,661

(22) Filed: Apr. 7, 2020

(65) Prior Publication Data

US 2020/0335676 A1 Oct. 22, 2020

(30) Foreign Application Priority Data

Apr. 22, 2019 (JP) .............................. JP2019-080754

(51) Int. Cl.
*H01L 33/58* (2010.01)
*H01L 25/075* (2006.01)
*H01L 33/50* (2010.01)
*H01L 33/60* (2010.01)

(52) U.S. Cl.
CPC .......... *H01L 33/58* (2013.01); *H01L 25/0753* (2013.01); *H01L 33/502* (2013.01); *H01L 33/60* (2013.01); *H01L 2933/0041* (2013.01); *H01L 2933/0058* (2013.01); *H01L 2933/0091* (2013.01)

(58) Field of Classification Search
CPC ......... H01L 25/0753; H01L 2933/0058; H01L 33/58–60
See application file for complete search history.

(56) References Cited

U.S. PATENT DOCUMENTS

2014/0362570 A1* 12/2014 Miyoshi .................... F21K 9/68
                                                                    362/240
2015/0103511 A1    4/2015 Miyashita
2015/0136306 A1*  5/2015 Wakamatsu ............. G02B 5/00
                                                                    156/67

(Continued)

FOREIGN PATENT DOCUMENTS

JP          2014143246 A      8/2014
JP          2014197690 A     10/2014

(Continued)

*Primary Examiner* — Jay C Chang
*Assistant Examiner* — Mikka Liu
(74) *Attorney, Agent, or Firm* — Global IP Counselors, LLP

(57) ABSTRACT

A method of manufacturing a light emitting device includes: forming light-shielding films respectively on an upper surface of a light-transmissive plate and a lower surface of the light-transmissive plate opposite to the upper surface; dividing the light-transmissive plate together with the light-shielding films from the upper surface to the lower surface or from the lower surface to the upper surface, to form a plurality of plate-shaped optical components; and fixing a cut surface of each of the optical components to a corresponding one of a plurality of light emitting elements, and arranging the light emitting elements on a substrate in a row or in a matrix so that the cut surfaces of the optical components and the light-shielding films are alternately arranged along a row direction in a lateral side view as seen in a direction parallel to the substrate and perpendicular to the row direction.

9 Claims, 5 Drawing Sheets

(56) References Cited

U.S. PATENT DOCUMENTS

| | | |
|---|---|---|
| 2015/0316215 A1 | 11/2015 | Togawa |
| 2016/0148912 A1 | 5/2016 | Higashino |
| 2016/0334077 A1 | 11/2016 | Wakamatsu et al. |
| 2018/0003349 A1 | 1/2018 | Miyoshi |

FOREIGN PATENT DOCUMENTS

| | | |
|---|---|---|
| JP | 2015076595 A | 4/2015 |
| JP | 2016100457 A | 5/2016 |
| JP | 2016219794 A | 12/2016 |
| JP | 2018011039 A | 1/2018 |
| WO | 2014087938 A1 | 6/2014 |

\* cited by examiner

METHOD OF MANUFACTURING LIGHT EMITTING DEVICE AND LIGHT EMITTING DEVICE

CROSS-REFERENCE TO RELATED APPLICATION

This application claims priority to Japanese Patent Application No. 2019-080754, filed on Apr. 22, 2019, the disclosure of which is hereby incorporated herein by reference in its entirety.

BACKGROUND

The present disclosure relates to a method of manufacturing a light emitting device and a light emitting device.

Semiconductor light emitting elements have been used not just as light sources for lightings replacing fluorescent lamps, but also as light sources with high directivity and high luminance such as projectors including vehicle headlamps, projection illumination and the like.

It is suggested that a light emitting device for such use includes a plurality of light emitting elements which are individually turned on/off, to thereby achieve a desired light distribution property (for example, Japanese Patent Publication No. 2014-197690 and Japanese Patent Publication No. 2016-100457).

SUMMARY

There exists a demand for a light emitting device with a desired light distribution property, having the sharp luminance difference between one of light emission surfaces in a lit state and an adjacent one of light emission surfaces in an unlit state, without causing a reduction in luminance of the light emitting device as a whole.

The present disclosure provides the following aspects.

(1) A method of manufacturing a light emitting device includes: forming light-shielding films respectively on an upper surface of a light-transmissive plate and a lower surface of the light-transmissive plate opposite to the upper surface; dividing the light-transmissive plate together with the light-shielding films from the upper surface to the lower surface or from the lower surface to the upper surface, to form a plurality of plate-shaped optical components; and fixing a cut surface of each of the optical components to a corresponding one of a plurality of light emitting elements, and arranging the light emitting elements on a substrate in a row or in a matrix so that the cut surfaces of the optical components and the light-shielding films are alternately arranged along a row direction in a lateral side view as seen in a direction parallel to an element-mounting surface of the substrate and perpendicular to the row direction.

(2) A light emitting device includes a substrate, a plurality of light emitting elements and a plurality of plate-shaped optical components. The light emitting elements are disposed on a substrate in a row or in a matrix. The plate-shaped optical components each has a pair of opposite lateral surfaces on which light-shielding films are respectively disposed, and another pair of opposite lateral surfaces on which the light-shielding films are not disposed. The optical components are respectively disposed on the light emitting elements so that the lateral surfaces of the optical components on which the light-shielding films are disposed and the lateral surfaces of the optical components on which the light-shielding films are not disposed are alternately arranged along a row direction in a lateral side view as seen in a direction parallel to an element-mounting surface of the substrate and perpendicular to the row direction The present disclosure provides a method of manufacturing a light emitting device with a desired light distribution property, having a sharp luminance difference between one of light emission surfaces in a lit state and an adjacent one of light emission surfaces in an unlit state without causing a reduction in luminance of the light emitting device as a whole, and the light emitting device with the above-described light distribution property.

DESCRIPTION

Figure 1A:
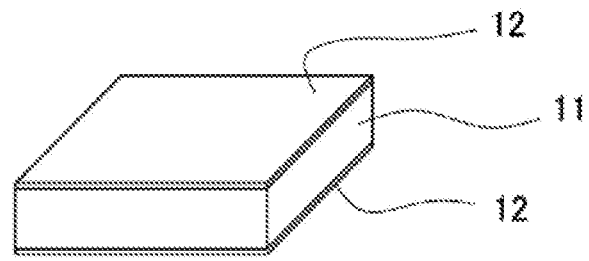
FIG. 1A is a schematic perspective view relating to a method of manufacturing a light emitting device according to one embodiment of the present disclosure.

In the present disclosure, for the sake of clarity, the size and positional relationship and the like of members shown in the drawings can be exaggerated. In the following description, identical or similar members are denoted by an identical name or reference numeral/character, and the detailed description thereof is omitted as appropriate. The content of one example and one embodiment similarly applies to other examples and other embodiments.

Method of Manufacturing Light Emitting Device

Figure 1B:
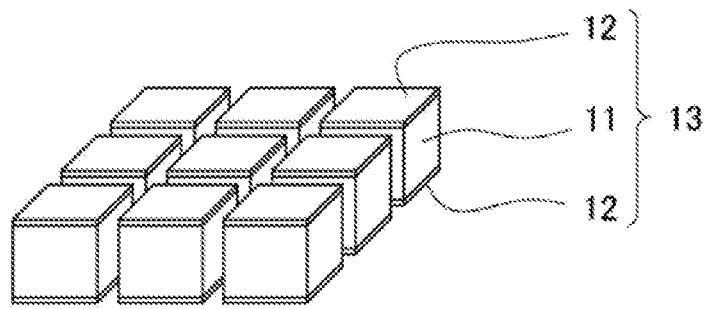
FIG. 1B is a schematic perspective view relating to the method of manufacturing the light emitting device according to the embodiment of the present disclosure.
Figure 1C:
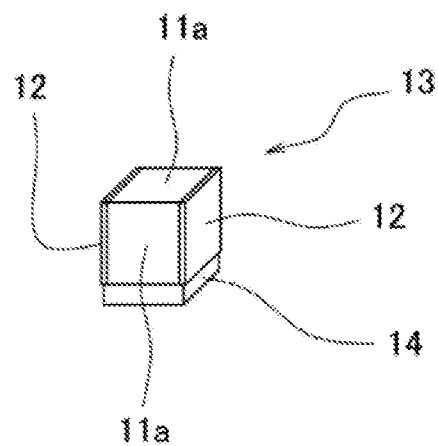
FIG. 1C is a schematic perspective view relating to the method of manufacturing the light emitting device according to the embodiment of the present disclosure.
Figure 1D:
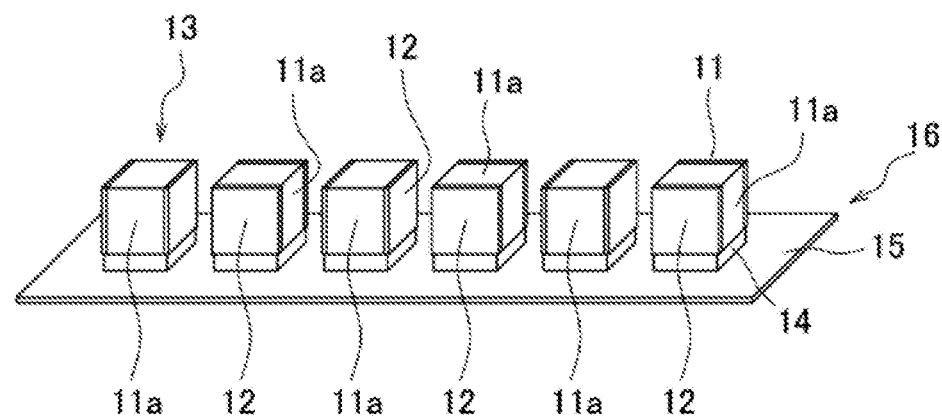
FIG. 1D is a schematic perspective view relating to the method of manufacturing the light emitting device according to the embodiment of the present disclosure.

As shown in FIGS. 1A to 1F, a method of manufacturing a light emitting device according to one embodiment includes: forming a light-shielding film 12 on each of an upper surface of a light-transmissive plate 11 and a lower surface of the light-transmissive plate 11 opposite to the upper surface (FIG. 1A); dividing the light-transmissive plate 11 together with the light-shielding films 12 from the upper surface to the lower surface or from the lower surface to the upper surface, to form a plurality of plate-shaped optical components 13 (FIG. 1B); fixing cut surfaces 11a of the optical components 13 to corresponding light emitting elements 14 (FIG. 1C); and arranging the light emitting elements 14 on the substrate 15 in a row or a matrix so that the cut surfaces 11a of the optical components 13 and the light-shielding films 12 are alternately arranged along the row direction as seen in a lateral side view (FIG. 1D).

This configuration can inhibit a reduction in luminance of the light emitting device as a whole, and realizes easily and simply manufacturing a light emitting device having the sharp luminance difference between one of light emission surfaces in a lit state and an adjacent one of light emission surfaces in an unlit state to thereby exhibit a desired light distribution property.

Figure 1E:
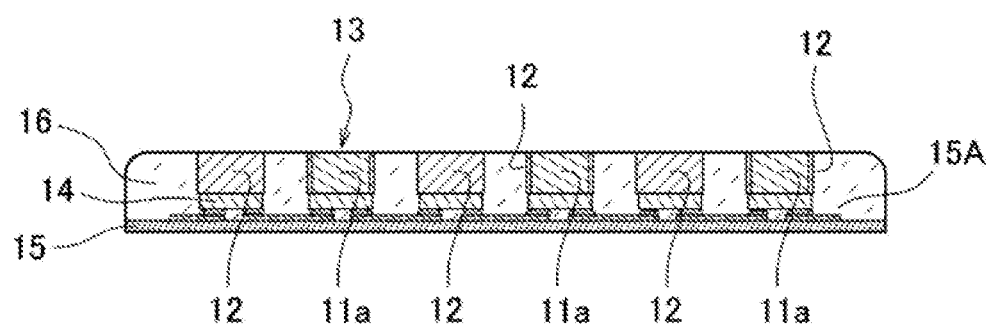
FIG. 1E is a schematic cross-sectional view relating to the method of manufacturing the light emitting device according to the embodiment of the present disclosure.
Figure 2:
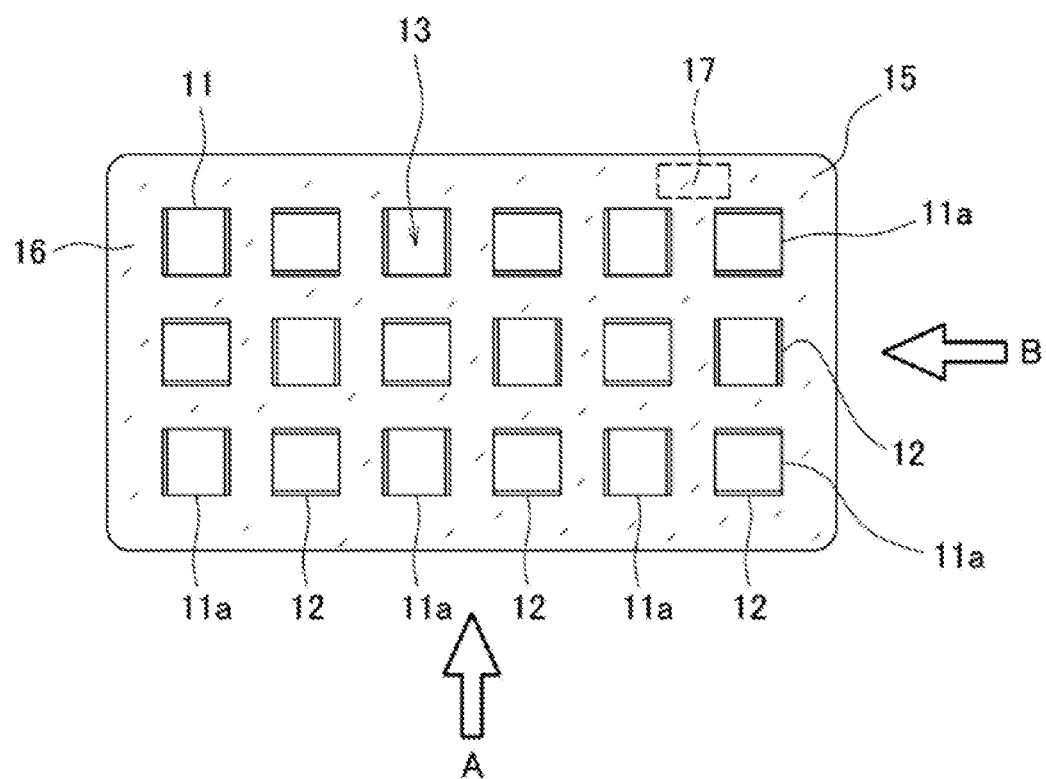
FIG. 2 is a top view of a light emitting device manufactured according to a method of manufacturing a light emitting device according to another embodiment of the present disclosure.

In this method of manufacturing a light emitting device, as shown in FIG. 2, the light emitting elements 14 can further be arranged on the substrate 15 in a matrix along the row direction and a column direction so that the cut surfaces 11a of the optical components 13 and the light-shielding films 12 are alternately aligned in the column direction as seen in a lateral side view (arrow B) (i.e., in a direction parallel to an element-mounting surface of the substrate and perpendicular to the column direction). The surface of the substrate on which the light emitting elements are mounted can be referred to as the element-mounting surface. Furthermore, as shown in FIG. 1E and others, lateral surfaces of the light emitting elements 14 on the substrate 15 can be covered with a light-reflective member 16, and/or lateral surfaces of the optical components 13 can be covered with the light-reflective member 16.

Forming Light-Shielding Film 12

As shown in FIG. 1A, firstly, a light-transmissive plate 11 is provided.

The light-transmissive plate can transmit, for example, light emitted from the light emitting elements (for example, light having a wavelength in a range of 320 nm to 850 nm) by 60% or more, preferably 70% or more. The light-transmissive plate preferably has a plate shape, and is preferably a plate-shape member having an upper surface and a lower surface opposite to the upper surface. The upper surface and the lower surface are preferably parallel to each other, but uneven portions can exist on these surfaces. In the present specification, being "parallel" allows a tolerance of about ±10° in the inclination of one surface relative to the other surface.

The size, shape and thickness of the light-transmissive plate can be set as appropriate by the size, number or the like of the light emitting device to be manufactured. For example, the thickness of the light-transmissive plate is preferably in a range of 10 μm to 1000 μm, and further preferably 30 μm to 500 μm.

The light-transmissive plate 11 can be formed of, for example, an inorganic material such as glass, ceramic, or sapphire, or organic material such as resin or hybrid resin including at least one of silicone resin, modified silicone resin, epoxy resin, modified epoxy resin, acrylic resin, phenolic resin, and fluorine resin.

The light-transmissive plate 11 can contain a fluorescent material, a light diffusion member or the like. Alternatively, a light diffusion member layer, light diffusion member, or the like can be provided on the upper surface and/or the lower surface of the light-transmissive plate 11.

Any fluorescent material capable of being excited by light from the intended light emitting element can be used. Examples of usable fluorescent material can be, for example, a cerium-activated yttrium-aluminum-garnet-based fluorescent material (e.g., $Y_3(Al,Ga)_5O_{12}$:Ce), a cerium-activated lutetium-aluminum-garnet-based fluorescent material (e.g., $Lu_3(Al,Ga)_5O_{12}$:Ce), a europium and/or chromium-activated nitrogen-containing calcium aluminosilicate-based fluorescent material (e.g., $CaO—Al_2O_3—SiO_2$:Eu), a europium-activated silicate-based fluorescent material (e.g., $(Sr,Ba)_2SiO_4$:Eu), a nitride-based fluorescent material such as a β-sialon-based fluorescent material (e.g., $Si_{6-z}Al_zO_zN_{8-z}$:Eu (0<Z<4.2)), a CASN-based fluorescent material (e.g., $CaAlSiN_3$:Eu), or a SCASN-based fluorescent material (e.g., $(Sr,Ca)AlSiN_3$:Eu), a manganese-activated potassium fluosilicate-based fluorescent material (e.g., $K_2SiF_6$:Mn), a sulfide-based fluorescent material, or a quantum dot fluorescent material. These fluorescent materials can be used solely or in combination. For example, a combination of any of these fluorescent materials and a blue-color light emitting element or a UV light emitting element can provide a light emitting device which emits light in desired colors (for example, a white-color-based light emitting device). In order to obtain a light emitting device capable of emitting light in white color, the type and concentration of the fluorescent material contained in the fluorescent material layer are adjusted accordingly. In such a case where the fluorescent material is contained in the light-transmissive material, the concentration of the fluorescent material is preferably in a range of, for example, 30% to 80%.

Examples of usable light diffusion member can be silica, titanium oxide, zirconium oxide, magnesium oxide, AEROSIL, glass, fillers such as glass fibers or wollastonite, aluminum nitride or the like.

Usable light-transmissive plate containing a fluorescent material can be, for example, a sintered body of a fluorescent material, of a molded body formed by mixing the fluorescent material and light transmissive material serving as a binder such as resin, glass, an inorganic substance or the like.

In the case in which the fluorescent material layer is disposed on the upper surface and/or lower surface of the light-transmissive plate, the thickness of the fluorescent material layer can be set as appropriate according to the material forming the fluorescent material layer, the content of the fluorescent material and the like. The fluorescent material layer is preferably thin. For example, the thickness thereof is preferably 50 μm or less, and more preferably 40 μm or less.

The fluorescent material layer can be formed by: molding the above-described material into a plate-shape; and dividing it into desired shapes. On one surface of the light-transmissive plate 11, a fluorescent material layer can be formed by printing, applying, spraying or the like.

In the case in which the light-transmissive plate contains a fluorescent material or includes a fluorescent material layer disposed on its upper surface or its lower surface, the fluorescent material and the light-transmissive plate can be mounted at once on the light emitting element. This contributes to simplifying the manufacturing process.

Subsequently, the light-shielding film 12 is formed on each of the upper surface and the lower surface of the provided light-transmissive plate 11.

The light-shielding film 12 is preferably formed of a material capable of cutting light from the light emitting element by 80% or more.

The light-shielding film 12 can be formed of, for example, metal such as Ti, Cr, Ni, Si, Al, Ag, Au, Pt, or Pd or alloy of the foregoing elements, a dielectric or the like. The dielectric body can have, for example, a multilayer structure in which a low-refractive-index layer and a high-refractive-index layer are layered on a base layer of, for example, oxide film. The dielectric body can be formed of, for example, a DBR (distributed Bragg reflector) film selectively reflecting light of a predetermined wavelength. Specifically, films differing from each other in refractive index can alternately be layered by a thickness corresponding to about the wavelength of the light emitting element, a thickness corresponding to the wavelength of the fluorescent material, or a thickness corresponding to the wavelength ¼ as great as the intermediate wavelength between those of the light emitting element and the fluorescent material. This configuration can highly efficiently reflect light having a predetermined wavelength. The material can contain at least one of oxide or nitride selected from the group consisting of Si, Ti, Zr, Nb, Ta, and Al.

The light-shielding film can be formed by a method known in the art, such as, sputtering, vapor deposition, or atomic layer deposition.

The thickness of the light-shielding film can be in a range of, for example, 0.2 µm to 5 µm, preferably 0.5 µm to 2 µm.

Forming Optical Component 13

As shown in FIG. 1B, the light-transmissive plate 11 provided with the light-shielding films 12 is divided from its upper surface to its lower surface or from its lower surface to its upper surface together with the light-shielding films 12, whereby a plurality of plate-shape optical components 13 is formed.

The dividing is preferably performed so that the cut surfaces become perpendicular to the upper surface and/or the lower surface of the light-transmissive plate 11 provided with the light-shielding films 12. In the present description, being "perpendicular" allows an inclination of ±10% or less. The dividing is preferably performed for a plurality of times in the direction parallel to one direction, for example, to one side of the light-transmissive plate, as seen in a plan view. Additionally, the dividing is preferably performed for a plurality of times in the direction crossing the one direction, for example, in the perpendicular direction. This dividing provides pieces of the light-transmissive plate provided with the light-shielding films at its upper and lower surfaces (hereinafter also referred to as "the light-transmissive pieces"). Additionally, this dividing easily provides a plurality of light-transmissive pieces of which plane shape is quadrangular.

The size and shape of the plurality of optical components obtained by the dividing can be set as appropriate according to the embodiment of the light emitting device to be obtained. For example, as seen in a plan view, they each can be a quadrangle having one or more sides in a range of 400 µm to 1500 µm.

In the optical component, the upper surface area and the lower surface area can be identical to each other. Alternatively, the upper surface area can be greater or smaller than the lower surface area. That is, the dividing of the light-transmissive plate 11 in this process can be performed with an inclination relative to the surfaces where the light-shielding films are formed, in other words, relative to the upper or lower surfaces of the light-transmissive plate. Such dividing can be employed in manufacturing optical components in which light distribution in a particular direction is intended. Here, the difference in area between the upper surface area and the lower surface area can be 1% to 20% as great as the area of the opposite surface thereof (i.e., the opposite lower surface or the opposite upper surface).

As will be described later, each optical component 13 is fixed on or above the light extraction surface, that is, the upper surface, of the corresponding light emitting element. In the present embodiment, the lower surface area of the optical component is preferably equal to or greater than the surface area of the light extraction surface of the light emitting element. Thus, in the case in which a bonding member is used to bond the light emitting element and the optical component, the lower surface having a larger area than an area of the light extraction surface of the light emitting element can inhibit the bonding member from leaking and creeping up the lateral surfaces of the optical component. This also can contribute to reducing the distance between the light emission surfaces. The size of the lower surface area can be, for example, 100% to 130%, preferably 103% to 120%, more preferably 104% to 110%, as great as the light extraction surface of the light emitting element 14. Preferably, the optical component has the size and shape by which the entire outer edge of the optical component coincides with, or positioned outer than, the outer edge of the light emitting element as seen in a top view. More preferably, the entire outer edge of the optical component is positioned outer than the outer edge of the light emitting element as seen in a top view. This configuration allows light emitted from the light extraction surface of the light emitting element to become efficiently incident on the optical component. This configuration also allows the distance between adjacent ones of the optical components 13 to be equal to or smaller than the distance between the light emitting elements, thereby contributing to reducing the distance between the light emission surfaces in the light emitting devices, and therefore is preferable.

Fixing Optical Components 13 onto Light Emitting Elements 14 and Arranging Light Emitting Elements 14 on Substrate 15

A plurality of light emitting elements 14 is provided.

Subsequently, for example as shown in FIG. 1C, the optical components 13 are respectively fixed onto the plurality of light emitting elements 14.

The optical components 13 are each fixed onto the corresponding light emitting element 14 so that the upper surface of the corresponding light emitting element 14 faces the cut surface 11a of the optical component 13. In other words, the optical component 13 is fixed so that the light-shielding films 12 on the optical component 13 become parallel to the lateral surfaces of the light emitting element 14.

The fixing the optical components to the light emitting elements can precede or succeed the arranging the light emitting elements on the substrate. That is, the optical components are fixed to the light emitting elements and thereafter the light emitting elements are arranged on the substrate, or the light emitting elements are arranged on the substrate and thereafter the optical components are fixed to the light emitting elements. In any of the cases, in each of the light emitting devices obtained through these processes, the light emitting elements 14 and the optical components 13 are arranged so that the cut surfaces 11a of the optical components 13 fixed onto the light emitting elements 14 and the light-shielding films 12 are alternately arranged along the row direction as seen in a lateral side view (i.e., in a direction parallel to the element-mounting surface of the substrate and perpendicular to the row direction).

Figure 1F:
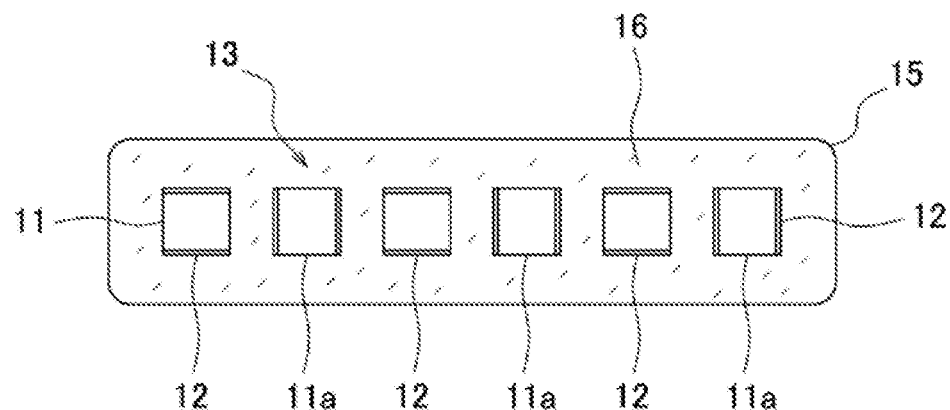
FIG. 1F is a top view corresponding to FIG. 1E.

For example, as shown in FIG. 1D, in the case in which the light emitting elements 14 are disposed only in one row, as seen in a lateral side view, the cut surfaces 11a of the optical components 13 and the light-shielding films 12 are alternately arranged along the row direction. In other words, as shown in FIG. 1F, as seen in a top view, the light emitting elements 14 are arranged so that one side of the cut surfaces 11a of the optical components 13 or one side of the light-shielding films 12 of the optical components 13 are arranged along the row direction on the substrate 15 with a state rotated by 90°.

In the case in which the light emitting elements 14 are arranged along a matrix, as seen in a lateral side view in the arrow A direction in FIG. 2 (i.e., a direction parallel to the element-mounting surface of the substrate and perpendicular to the row direction), the light emitting elements 14 onto which the optical components 13 are fixed are arranged so that the cut surfaces 11a of the optical components 13 and the light-shielding films 12 are alternately arranged along the row direction. At the same time, as seen in a lateral side view in the arrow B direction in FIG. 2 (i.e., a direction parallel to the element-mounting surface of the substrate and perpendicular to the column direction) also, the light emitting elements 14 onto which the optical components 13 are fixed are arranged so that the cut surfaces 11a of the optical components 13 and the light-shielding films 12 are alternately arranged along the column direction. In other words, as shown in FIG. 2, as seen in a top view, the light emitting elements 14 onto which the optical components 13 are fixed are arranged so that one side of the cut surfaces 11a of the optical components 13 or one side of the light-shielding films 12 thereof are arranged in both of the column and row directions on the substrate 15 in a state rotated by 90°.

Figure 3A:
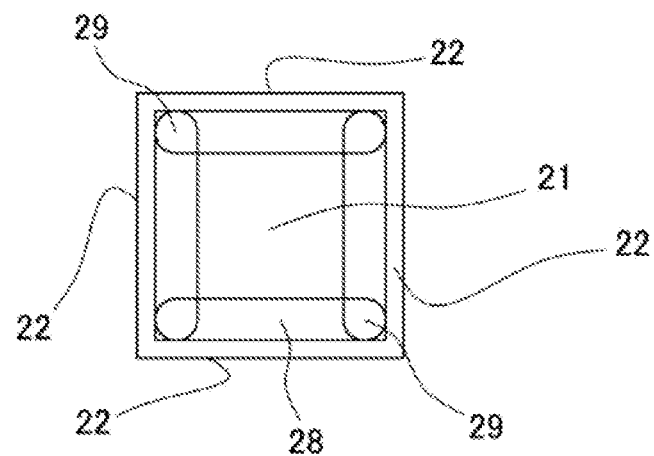
FIG. 3A is a schematic illustration showing the luminance on the light extraction surface side in a light emitting device according to a comparative example.
Figure 3B:
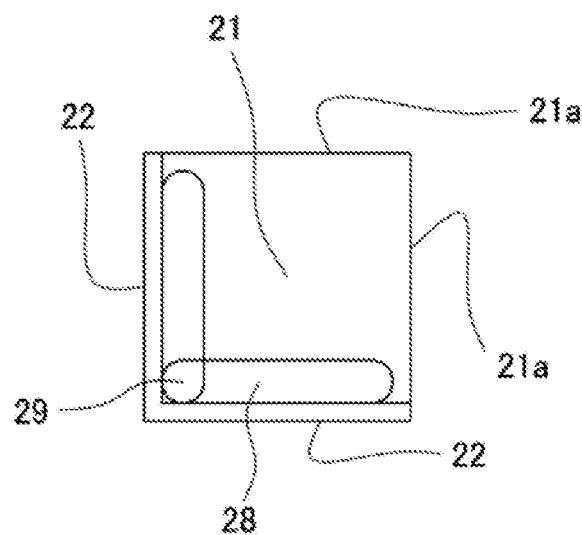
FIG. 3B is a schematic illustration showing the luminance on the light extraction surface side in a light emitting device according to another comparative example.

In general, in a plurality of arranged light emitting elements, in order to achieve a sharp difference in luminance between adjacent ones of the light emitting elements respectively turned on and off, with the quadrangular optical components 21 for example, it is effective to dispose the light-shielding films 22 on the four lateral surfaces of each optical component 21 as shown in FIG. 3A. On the other hand, the light-shielding films 22 considerably absorb light. Accordingly, in the case in which the optical component 21 provided with the light-shielding films 22 at the four lateral surfaces is fixed onto the light emitting element and seen from the upper surface, the brightness and luminance of the optical component 21 reduce at vicinity regions 28 of the light-shielding films 22 on the light emission surface of the light emitting element. Accordingly, as shown in FIGS. 3A and 3B, in the case in which the light-shielding films 22 are disposed at the four lateral surfaces of the optical component (FIG. 3A) or at the adjacent two lateral surfaces (FIG. 3B), as seen in a top view, a corner region interposed between the light-shielding films 22, that is, at an overlapping region 29 where the vicinity regions 28 of the light-shielding films 22 overlap, the brightness and luminance significantly reduce.

In contrast, as has been described above and shown in FIG. 3C, in the case in which the light-shielding films 22 are disposed only at opposite two lateral surfaces of each optical component 21 and other two lateral surfaces are left as the cut surfaces 21a, as seen in a top view, the vicinity regions 28 of the light-shielding films 22 are positioned only at the opposite two lateral surfaces on the light emission surface of the light emitting element. This can avoid the generation of a region where the brightness and luminance are significantly low, as in the overlapping region 29. As a result, on the entire surface of the light emitting device on which the plurality of light emitting elements is arranged, a reduction in brightness and luminance is can be inhibited and substantially the original brightness and luminance can be maintained. At the same time, light is shielded in two adjacent directions or four directions in the row direction or the column and row directions of the light emitting element arrangement. This can inhibit leakage of light between adjacent ones of the light emitting elements. This can provide, for example, a sharp difference in luminance between the non-light-emitting part and the light-emitting part, and hence a desired light distribution can be obtained. Such a light emitting device is advantageously used as automotive headlamps, particularly, adaptive driving beam headlamps.

The optical components can be fixed onto the light emitting elements with or without a bonding member interposed therebetween. The bonding member can be a light-transmissive bonding member or an organic adhesive agent with a high refractive index. Alternatively, the optical components can be directly fixed onto the light emitting elements by press-bonding, sintering, or bonding technique performed at room temperature such as surface-activated bonding or atomic diffusion bonding.

The light-transmissive bonding member can be a member that transmits light from the light emitting elements by 60% or 70% or more. For example, the light-transmissive bonding member can be formed of resin exemplarily noted above as the material of the light-transmissive plate. The bonding member can contain a light diffusion member, a fluorescent material or the like. The bonding material is preferably disposed by a thickness of nearly 0 μm between the upper surface of each light emitting element and corresponding optical component. The thickness can be for example 10 μm or less. Specifically, the thickness can be in a range of 3 μm to 7 μm. The bonding member can be disposed so as to cover part of or the entire lateral surfaces of the light emitting element. In this case, the bonding member is preferably disposed so as to spread in fillet shape from the lateral surfaces of the light emitting element to the lower surface of the optical component.

The plurality of light emitting elements 14 is preferably disposed on the substrate 15 so as to be spaced apart from one another. The optical components 13 on the light emitting elements 14 mounted on the substrate 15 are also preferably spaced apart from one another. For example, the distance between the light emitting elements 14 or the optical components 13 can be in a range of 30 μm to 100 μm, preferably 50 μm to 70 μm. With such a distance, in the case in which some of the plurality of light emitting elements is turned on, on the light emission surface side of the light emitting device, light is less likely to leak from the turned-on light emitting element to the optical component on the adjacent turned-off light emitting element. This can provide the light emitting device with a sharp difference in luminance between the light-emitting part and the non-light-emitting part.

The substrate can be one usable for mounting light emitting elements. For example, the usable substrate can be formed of an insulating member such as glass epoxy, resin, or ceramic, or a metal member provided with an insulating member on its surface. Among those, the substrate is preferably formed of ceramic which is highly heat resistant and weather resistant. The ceramic material can be alumina, aluminum nitride, or mullite. These types of ceramic material can be combined with an insulating material such as, for example, BT resin, glass epoxy, or epoxy-based resin. The substrate preferably includes wirings connected to the light emitting elements on its surface normally. The wirings are preferably formed so that the light emitting elements are desirably driven, particularly preferably individually driven, on the substrate.

For the light emitting elements, light emitting diodes can be used as a normal adoption. A plurality of light emitting elements is included in one light emitting device.

The light emitting elements can be selected as appropriate according to their composition, emission light color or wavelength, size, number of pieces, intended use and the like. For example, blue-color and green-color light emitting elements can be those including a semiconductor layer of ZnSe, a nitride-based semiconductor ($In_xAl_yGa_{1-X-Y}N$, $0 \leq X$, $0 \leq Y$, $X+Y \leq 1$), GaP or the like. Red-color light emitting elements can be those including a semiconductor layer such as GaAlAs, AlInGaP or the like.

The light emitting elements are normally obtained by layering a semiconductor layer on a light-transmissive supporting substrate (e.g., sapphire substrate). The substrate is positioned at the upper surface side of the light emitting elements, and serves as the main light extraction surface of the light emitting elements. The bonding surface of the supporting substrate can have an uneven surface at the bonding surface relative to the semiconductor layer. Thus, the critical angle at which the light emitted from the semiconductor layer becomes incident on the substrate is intentionally changed, to facilitate extraction of light to the outside of the substrate.

In each light emitting element, the supporting substrate can be removed after the semiconductor layer is formed. The removing can be performed by, for example, polishing, LLO (laser lift off) or the like. In the case in which the supporting substrate is removed, the surface of the semiconductor layer nearest to the supporting substrate becomes the upper surface of each light emitting element, and functions as the main light extraction surface of the light emitting element.

Each light emitting element preferably includes a pair of positive and negative electrodes on an identical surface side. This allows the light emitting element to be flip-chip mounted on a mount substrate. The surface opposite to the surface on which the pair of electrodes are formed functions as the light extraction surface.

The number of the light emitting elements can be set as appropriate according to the characteristics, size and the like of the light emitting device to be obtained. The plurality of light emitting elements is preferably aligned close to one another. Taking into consideration of the luminance distribution of the light emitting device and use in an automotive application, the distance between adjacent ones of the light emitting elements is preferably smaller than the size of each light emitting element (for example, the length of one side). For example, the distance is more preferably about 30% or less, further preferably 20% or less, as small as the light emitting element itself. Specifically, while it depends on the size of the light emitting element, the distance can be in a range of 30 μm to 300 μm, preferably 40 μm to 100 μm, and further preferably 50 urn to 80 μm.

Forming Light-Reflective Member 16

In the method of manufacturing a light emitting device, as shown in FIG. 1E, it is preferable to form the light-reflective member 16 which covers part of or the entire lateral surfaces of the light emitting elements 14 mounted on the substrate 15. In addition to the lateral surfaces of the light emitting elements 14, the light-reflective member 16 can cover part of or the entire lateral surfaces of the optical components 13. Particularly, the light-reflective member 16 preferably covers the entire lateral surfaces of the light emitting elements 14 and the entire lateral surfaces of the optical components 13. Although the upper surface of the light-reflective member 16 can be at a position higher than the upper surfaces of the optical components 13, the upper surface of the light-reflective member 16 is preferably recessed from or flush with the upper surfaces of the optical components 13.

In general, the light emitted from the upper surfaces (i.e., light exiting surfaces) of the optical components also spreads in the lateral direction. In the case in which the upper surface of the light-reflective member is at a position higher than the upper surfaces of the optical components, the light emitted from the upper surfaces of the optical components is reflected by the light-reflective member, resulting in variations in light distribution. In contrast, the lateral surfaces of the optical components can be covered with the light-reflective member with the height of the light-reflective member surrounding the periphery of the lateral surfaces being the same height as or lower than the height of the optical components. Accordingly, light emitted from the upper surface of the optical components can be entirely extracted to the outside.

The light-reflective member is formed of a material capable of reflecting light emitted from the light emitting elements. This allows the light emitted from the light emitting elements to be reflected by the interface between the optical components 13 or the light emitting elements 14 and the light-reflective member 16 into the optical components 13 or the light emitting elements 14. Thus, the reflected light is allowed to efficiently exit to the outside from the upper surfaces of the optical components 13.

The light-reflective member is preferably formed of an insulating material, for example, a resin material. The resin material can be at least one resin or hybrid resin selected from a group consisting of silicone resin, modified silicone resin, epoxy resin, modified epoxy resin, acrylic resin, phenolic resin, and fluorine resin. The light-reflective member can be formed of such a resin material containing a light-reflective substance. Examples of the usable light-reflective substance includes titanium oxide, silicon oxide, zirconium oxide, potassium titanate, alumina, aluminum nitride, boron nitride, or mullite.

The light-reflective member can have its light reflection amount, light transmission amount and the like changed according to the distance between adjacent ones of the light-transmissive members. Accordingly, the content of the reflective substance can be adjusted as appropriate according to the characteristics and the like of the light emitting device desired to be obtained. For example, preferably, the content of the reflective substance is 30 wt % or more relative to the total weight of the light-reflective member, and the thickness of the light-reflective member is 50 μm or more or 100 μm or more.

The light-reflective member can be formed by, for example, injection molding, potting molding, resin printing, transfer molding, or compression molding.

Light Emitting Device

As shown in FIGS. 1E and 1F, the light emitting device according to one embodiment includes: the optical components 13 and the plurality of light emitting elements. The optical components 13 each have a plate like shape and have opposite two lateral surfaces on which the light-shielding films 12 are disposed and other opposite two lateral surfaces on which the light-shielding films 12 are not disposed. The plurality of light emitting elements 14 are disposed on the substrate 15 in a row or in a matrix. The optical components 13 are respectively disposed on the light emitting elements 14 so that the lateral surfaces of the optical components 13 on which the light-shielding films 12 are disposed and the lateral surfaces of the optical components 13 on which the light-shielding films 12 are not disposed are alternately aligned along the row as seen in a lateral side view. The light emitting device further includes the light-reflective member 16 formed on the substrate 15 while covering the lateral surfaces of the light emitting elements 14 and the optical components 13. As used herein, the lateral surfaces on which the light-shielding films 12 are not formed refer to the cut surfaces 11a as described above.

For example, in mounting the light emitting device on a headlamp or the like, it is important to avoid that a portion of light irradiates unwanted portion; to avoid the occurrence of glare; and to have a clear boundary (i.e., good distinguishability) between the light-emitting part and the non-light-emitting part.

In the light emitting device according to the present embodiment, while the distance between the light emission surfaces is reduced to the extent possible, the light emitted from the light emitting elements and becoming incident on the optical components is inhibited from propagating in the lateral direction and/or the longitudinal direction, whereby leakage of light in the lateral direction and/or the longitudinal direction is securely inhibited. As a result, the light emitting device can achieve high contrast (i.e., sharp luminance difference) can be obtained between the turned-on light emitting elements and turned-off light emitting elements or between the light-emitting part (i.e., the light extraction surfaces of the light emitting elements) and the non-light-emitting part (i.e., the portion between the light emitting elements) while being further reduced in size.

Figure 3C:
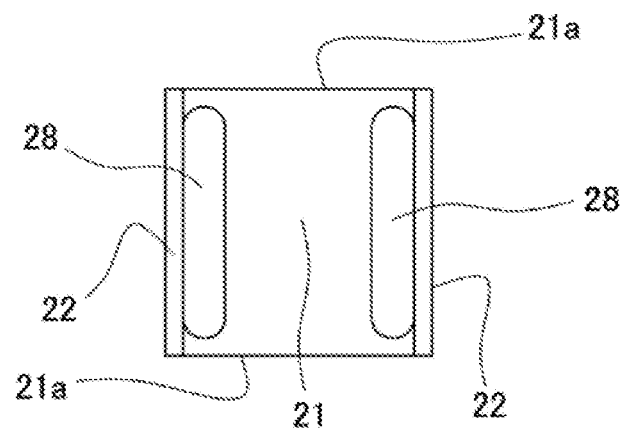
FIG. 3C is a schematic illustration showing the luminance on the light extraction surface side in the light emitting device according to a certain embodiment of the present disclosure.

That is, as shown in FIG. 3C, as seen in a top view, the vicinity regions 28 of the light-shielding films 22 are positioned only on opposite two lateral surfaces on the light emission surface of each light emitting element. This can avoid the occurrence of a region where brightness and luminance are significantly low, such as the overlapping region 29 where the vicinity regions of the light-shielding films 22 overlap with each other shown in FIGS. 3A and 3B. As a result, over the entire surface of the light emitting device including the plurality of light emitting elements, a reduction in brightness and luminance is inhibited, and substantially the original brightness and luminance can be maintained. At the same time, the light is cut in adjacent two directions or four directions in the row direction or the column and row directions of the light emitting elements. In particular, in the case in which the light emitting elements and the optical components are arranged in column and row directions, the light from turned-on light emitting elements can be blocked in four directions by the light-shielding films 22 of the optical components disposed respectively on adjacent ones of light emitting elements, without creating the overlapping region 29 where the vicinity regions 28 of the light-shielding films 22 overlap in which brightness and luminance are reduced. This can inhibit leakage of light between adjacent ones of light emitting elements, and achieves sharp luminance difference between the non-light-emitting part and the light-emitting part. Thus, the light emitting device can provide a desired light distribution.

In the light emitting device, an electronic component 17 such as a protective element can be mounted as shown in FIG. 2. The electronic component 17 can be, for example, embedded in the light-reflective member 16. This can prevent a reduction in light extraction efficiency because of the electronic component absorbing or blocking light from the light emitting elements 14.

The light emitting device of the present disclosure is advantageously applicable to automotive headlamps, in particular, adaptive driving beam headlamps. The light emitting device of the present disclosure can also be used as any of various kinds of light sources, such as a light source for lighting apparatus, a light source for various kinds of indicators, an on-vehicle light source, a display light source, a light source for backlight of liquid crystal, a signal light, an in-vehicle component, channel letters for signboards and the like.

What is claimed is:

1. A light emitting device comprising:
a substrate;
a plurality of light emitting elements disposed on a substrate in a row or in a matrix;
a plurality of plate-shaped optical components each having a pair of opposite lateral surfaces on which light-shielding films are respectively disposed, and another pair of opposite lateral surfaces on which the light-shielding films are not disposed, the optical components being respectively disposed on the light emitting elements so that the lateral surfaces of the optical components on which the light-shielding films are disposed and the lateral surfaces of the optical components on which the light-shielding films are not disposed are alternately arranged along a row direction in a lateral side view as seen in a direction parallel to an element-mounting surface of the substrate and perpendicular to the row direction.

2. The light emitting device according to claim 1, wherein the lateral surfaces of one or more of the optical components are perpendicular to an upper surface and a lower surface of a corresponding one of the optical components.

3. The light emitting device according to claim 1, further comprising
a light-reflective member covering lateral surfaces of the light emitting elements on the substrate.

4. The light emitting device according to claim 1, further comprising
a light-reflective member covering the lateral surfaces of the optical components.

5. The light emitting device according to claim 1, wherein each of the light shielding films is formed of a distributed Bragg reflector.

6. The light emitting device according to claim 1, wherein a thickness of each of the light shielding films is in a range of 0.2 µm to 5 µm.

7. The light emitting device according to claim 1, wherein the light emitting elements are arranged on the substrate so that a distance between adjacent ones of the light emitting elements is 30 µm to 100 µm.

8. The light emitting device according to claim 1, wherein each of the optical components contains a fluorescent material.

9. The light emitting device according to claim 1, wherein each of the light-shielding films is formed of a metal or an alloy of metals selected from the group consisting of Ti, Cr, Ni, Si, Al, Ag, Au, Pt, and Pd.

* * * * *